United States Patent [19]
Yang et al.

[11] Patent Number: 6,074,486
[45] Date of Patent: Jun. 13, 2000

[54] APPARATUS AND METHOD FOR MANUFACTURING A SEMICONDUCTOR DEVICE HAVING HEMISPHERICAL GRAINS

[75] Inventors: Chang-jip Yang; Chan-hee Han, both of Suwon; Young-kyou Park; Jae-wook Kim, both of Seoul, all of Rep. of Korea

[73] Assignee: Samsung Electronics Co., Ltd., Suwon, Rep. of Korea

[21] Appl. No.: 09/062,715

[22] Filed: Apr. 20, 1998

[30] Foreign Application Priority Data

Apr. 22, 1997 [KR] Rep. of Korea ............ 97-14954

[51] Int. Cl.7 .................................................. C23C 16/00
[52] U.S. Cl. ...................... 118/719; 118/715; 118/730
[58] Field of Search .................... 118/719, 715, 118/730

[56] References Cited

U.S. PATENT DOCUMENTS

| | | | |
|---|---|---|---|
| 4,962,726 | 10/1990 | Matsushita | 118/719 |
| 5,433,785 | 7/1995 | Saito | 118/719 |
| 5,443,648 | 8/1995 | Ohkase | 118/730 |
| 5,520,743 | 5/1996 | Takahashi | 118/730 |
| 5,925,188 | 7/1999 | Oh | 118/715 |

FOREIGN PATENT DOCUMENTS

| | | |
|---|---|---|
| 61-71625 | 4/1986 | Japan . |
| 1-220434 | 9/1989 | Japan . |
| 2-1116 | 1/1990 | Japan . |
| 3-122532 | 12/1991 | Japan . |
| 6-349761 | 12/1994 | Japan . |

OTHER PUBLICATIONS

Extended Abstracts of the 1992 International Conference on Solid State Device; H. Watanabe et al. "Hemispherical Grained Silicon (HSG–SI) Formation on In–Situ Phosphorous Doped Amorphous–Si Using the Seeding Method": pp. 422–424.

*Primary Examiner*—Richard Bueker
*Attorney, Agent, or Firm*—Jones Volentine, LLP

[57] ABSTRACT

An apparatus and method for forming a HSG silicon layer on a capacitor lower electrode of a semiconductor memory device. The apparatus includes a processing chamber having a plurality of source gas supply nozzles, the lengths of the nozzles being different from one another so as to uniformly supply a source gas. A loadlock chamber is placed under the processing chamber. A boat loaded with wafers is moved from the loadlock chamber to the processing chamber, with the boat being rotated while the source gas is supplied. The processing chamber and loadlock chambers are connected to a vacuum system having two vacuum pumps for maintaining a vacuum in the chambers. A third vacuum pump, connected to the processing chamber, is operated when the vacuum in the processing chamber reaches a predetermined value.

20 Claims, 5 Drawing Sheets

APPARATUS AND METHOD FOR MANUFACTURING A SEMICONDUCTOR DEVICE HAVING HEMISPHERICAL GRAINS

BACKGROUND OF THE INVENTION

1. Field of the Invention

The present invention relates to an apparatus and method for manufacturing semiconductor devices. More particularly, the present invention relates to an apparatus and method for manufacturing semiconductor devices having hemispherical grains (HSG) on the lower electrode of the capacitor of a semiconductor memory device.

2. Description of the Related Art

Semiconductor memory devices are becoming more highly integrated as developments progress from the 16M and 64M DRAM (Dynamic Random Access Memory) devices, to the 256M and greater capacity memory devices. Even as the sophistication and capacity of the device itself increases, there are ongoing efforts to keep the devices as small as possible for subsequent implementation in miniature electronic products. In view of this desire to obtain smaller devices, the space for each memory cell must be reduced accordingly.

Generally, each memory cell unit of a DRAM is composed of a MOS (Metal Oxide Semiconductor) transistor and a capacitor. Even with the reduced cell size as described above, the memory device must still have a sufficient minimum threshold capacitance in order to function properly.

A semiconductor capacitor includes a lower electrode (storage electrode) and an upper electrode (plate electrode), with a dielectric material between the two electrodes. The capacitance of the capacitor is proportional to the effective area of the electrodes and inversely proportional to the distance between the two electrodes, i.e., the thickness of the dielectric. Therefore, in order to increase capacitance, it is necessary to increase the effective capacitor area and/or decrease the thickness of the dielectric. Also, it is advantageous to have a dielectric with a high permittivity or dielectric constant.

Various methods have been proposed to provide a capacitance above a certain minimum threshold level. One such method of increasing the surface area of the semiconductor capacitor is to use the properties of material itself, for example, by forming the lower electrode of the capacitor with a HSG silicon layer. Such a technique is disclosed in H. Watanabe et al., "Hemispherical Grained Silicon Formation on In-Situ Phosphorous Doped Amorphous-Si Using The Seeding Method", SSDM'92 pp 422–424.

Briefly, the lower electrode of the DRAM capacitor is the part that stores information via electrons which are transferred through contact holes from a source area of MOS transistor. The lower electrode is formed on the semiconductor substrate, with an intermediate insulating film formed between the lower electrode and the substrate. A silicon oxide film is generally used as the intermediate insulating film.

The lower electrode is formed using, for example, phosphorous-doped amorphous silicon by low pressure chemical vapor deposition (CVD) techniques. After forming the lower electrode and the intermediate insulating film over the substrate, a lower electrode pattern is formed using conventional photolithography techniques know to those skilled in the art. Thereafter, the HSG silicon layer is formed over the exposed surface of the lower electrode pattern. The HSG silicon layer increases the surface area of the capacitor by relying on the fact that a hemisphere-shaped area is formed at the transition temperature ranges of crystalline-Si and amorphous-Si by silicon migration, with its surface energy being stable. The HSG forming method also relies on the fact that silicon gas groups, such as $Si_2H_6$ and $SiH_4$, have reactive surfaces, and that inner portions of the silicon layer form protrusions that serve as a seed for particles deposited during the CVD process, making the wafer surface rough. This roughened surface increases the effective surface area of the electrode which thereby increases the capacitance of the capacitor.

In the conventional process for forming a HSG silicon layer, a temperature stabilization step maintains a constant temperature, for example, 580° C., inside a CVD apparatus having a high vacuum state. In a subsequent seeding step, a seeding gas comprised of molecules of $Si_2H_6$ or $SiH_4$ are irradiated on the surface of the exposed lower electrode, with the molecules exhibiting active surface reactions. Next, thermal treatment is carried out to form the HSG silicon layer. The surface of the HSG layer is thus characterized by concave and convex hemispherical shapes due to the thermal migration of silicon particles.

During manufacturing of a capacitor as described above, two kinds of loading methods for the wafer substrates are utilized. The first method is a single wafer loading method, in which each wafer to be processed is moved one by one. The second method is a batch type loading method, in which dozens of wafers are simultaneously moved. Although the former method is good for maintaining uniform processing conditions, it results in poor productivity. Thus, the latter batch type method is preferred since productivity is enhanced.

However, batch type loading is problematic because the particular processing conditions experienced by the wafers vary slightly due to the different positions of the wafers inside the processing chamber. Therefore, it is important to try and maintain uniform processing conditions across the entire wafer batch.

FIG. 1 is a schematic representation of a conventional semiconductor device fabrication apparatus incorporating a vertical low pressure chemical vapor deposition apparatus for use in the HSG formation process.

As shown in FIG. 1, a processing chamber 20 is vertically aligned with and disposed above a loadlock chamber 10. A gate valve 14 is installed between the processing chamber 20 and the loadlock chamber 10, and a boat 12 with wafers loaded thereon is placed inside the loadlock chamber 10.

The processing chamber 20 has a double tube structure, that is, an outer tube 26 being dome-shaped, with its top end sealed, covering an inner tube 24 with its top end open. A single gas supply nozzle 22 is disposed in the inner tube 24 and supplies a source gas through an opening in a flange 16 connecting the processing chamber 20 and the loadlock chamber 10.

The gas supply nozzle 22 includes a plurality of spray openings 23, spaced at equal intervals from each other. A heat block 28 encases the outer tube 26.

A vacuum system is installed to maintain the loadlock chamber 10 and the processing chamber 20 under vacuum. The vacuum system includes a loadlock chamber vacuum line 43, having an air valve 36, connected to a lower part of the loadlock chamber 10. The loadlock chamber vacuum line 43 is configured to discharge through the mechanical booster pump 30 and dry pump 32. The vacuum system also includes a processing chamber vacuum line 44, having an air valve 34, which is connected to the processing chamber 60 and is also configured to discharge through the mechanical booster pump 30 and dry pump 32.

FIG. 2 is a detailed representation of the vacuum system for the apparatus shown in FIG. 1. The processing chamber vacuum line 44 contains a bypass vacuum line, having an air valve 35 and a hand valve 33 installed thereon, connected on either side of the air valve 34. A purge gas supply line having flow meters 37 and 38, a check valve 41, and an air valve 40 are installed in order to clean mechanical booster pump 30 and dry pump 32. Another bypass line having an air valve 39 and a check valve 42 installed thereon, is oriented so as to bypass the mechanical booster pump 30 and the dry pump 32. A pirani gauge 45 for measuring pressure is installed before the mechanical booster pump 30.

Referring to FIG. 1 and FIG. 2, in the conventional HSG silicon formation process, a boat 12 loaded with wafers, each having a lower electrode thereon, is moved into the loadlock chamber 10 through the side wall of the loadlock chamber 10 by a wafer transportation means. Thereafter, contaminants and native oxide films are prevented from forming on the wafers by operating the vacuum line of the loadlock chamber 10 so as to maintain the loadlock chamber 10 under a nitrogen atmosphere in a high pressure or in a vacuum state. Then, gate valve 14 is opened, and boat 12 is transferred into the processing chamber 20 by an elevator (not shown).

After stabilizing the temperature of the processing chamber, the temperature of the processing chamber 20 is increased up to a designated level in order to maximize HSG nucleus generating conditions. The silicon group gas is supplied as seeding gas through the gas supply nozzle 22, and the thermal treatment for nuclei growth is performed by operating the processing chamber vacuum line so as to maintain the processing chamber in a high vacuum state.

After the HSG silicon layer is formed on the lower electrode of the capacitor, the boat 12 is moved back to the loadlock chamber 10 for cooling, and the process is complete.

The above conventional apparatus for manufacturing semiconductor devices using batch-type loading has good productivity, but the processing conditions are different throughout every position of the wafers inside the boat such that the processing results are not uniform throughout the wafers in the same batch. Also, for HSG nucleus growth, it takes too long a time to reach the desired vacuum state inside the processing chamber 20, so that silicon migration is difficult and the size of the hemispherical silicon nucleus is reduced.

SUMMARY OF THE INVENTION

The present invention is directed to an apparatus which provides for the formation of a uniform film throughout each of a plurality of wafers placed in the same batch during the semiconductor device fabrication process.

Another object of the present invention is to provide an apparatus for manufacturing semiconductor devices which provides for the ready formation of HSG silicon nuclei having a predetermined density and size, on the lower electrode of the capacitor.

A further object of the present invention is to provide a method for manufacturing semiconductor devices using the above apparatus according to the present invention.

To achieve these and other advantages and in accordance with the purpose of the present invention, as embodied and broadly described, the apparatus for manufacturing semiconductor devices, includes: a processing chamber; a loadlock chamber disposed under the processing chamber; a vacuum system connected to the processing chamber and the loadlock chamber; and a plurality of gas supply nozzles placed inside the processing chamber, each of the gas supply nozzles having a different length from each other, and having a plurality of spray openings vertically aligned at uniform intervals for spraying a source gas uniformly throughout the inside of the processing chamber.

The plurality of supply nozzles are installed along the bottom of the processing chamber, and they can be oriented in close proximity to each other, or spaced apart in equal intervals along the bottom of the processing chamber.

The gas supply nozzles include a first supply nozzle for supplying a source gas to an upper area of the processing chamber, a second supply nozzle for supplying a source gas to a middle area of the processing chamber, and a third supply nozzle for supplying a source gas to a bottom area of the processing chamber, with all of the supply nozzles being vertically aligned with respect to one another. Preferably, the top ends of the first and second supply nozzles are sealed, and the bottom end of the third supply nozzle is open.

More preferably, the diameter of the spray openings of the gas supply nozzles would increase the closer the spray opening is to the terminal end of the nozzle (upper end). Each of the gas supply nozzles may branch of a single supply line connected to a single source gas supply. Alternatively, each nozzle may have its own dedicated supply line connected to a different respective source gas supply, for supplying one or more types of source gas to the chamber if required or desired.

According to a second embodiment of the present invention, there is provided an apparatus for transporting wafers in a boat between the processing chamber and the loadlock chamber. The transporting apparatus includes an elevator for reciprocally moving the boat between the processing chamber and the loadlock chamber, and rotating a apparatus for rotating the boat when in the processing chamber.

The rotating apparatus includes a boat support for mounting the boat thereon, a motor for rotating the boat support about a motor shaft axis, and a controller for controlling the rotation speed of the boat. The rotating apparatus rotates the boat after it is moved into the processing chamber to ensure uniform processing of the wafers.

According to a third embodiment of the present invention, the vacuum system includes a loadlock line having one end connected to the loadlock chamber and a processing line having one end connected to the processing chamber. Both the loadlock and the processing lines merge at a first junction prior to passing through a first vacuum pump and a second vacuum pump. A bypass vacuum line originating from the processing line passes through a third vacuum pump, and then merges again with the processing line at a point between the first junction and the first vacuum pump.

The first, second, and third vacuum pumps are a mechanical booster pump, a dry pump, and a turbo molecular pump respectively, and preferably, purge gas supply and discharge lines are installed in order to clean the inside of the third vacuum pump.

The inside of the processing vacuum line and the bypass vacuum line are polished so as to maximize the vacuum state. A heating means is installed along portions of the processing line and bypass line between the third vacuum pump and the processing chamber, to minimizing the byproduct produced after the processing is completed.

A nitrogen gas supply line and an oxygen gas supply line are installed in the loadlock chamber to remove contaminants and control the formation of native oxide films.

In another aspect, the present invention provides a method for producing semiconductor devices using the above apparatus. The method includes loading wafers to be processed into a wafer boat, maintaining the loadlock chamber in a vacuum state by operating the first and second vacuum pumps of the loadlock chamber vacuum system, moving the wafer boat from the loadlock chamber to the processing chamber, processing the wafers by supplying a source gas into the processing chamber while operating the first and second vacuum pumps to maintain the processing chamber vacuum; and operating the third vacuum pump of the bypass vacuum line when the pressure of the processing chamber reaches a certain predetermined value. The third vacuum pump of the bypass vacuum line is operated to reach a base vacuum state quickly during the step of growing the HSG nuclei, so as to maximize silicon migration.

After the wafer boat moves into the processing chamber, the wafer boat is then rotated to achieve uniform processing. A source gas is uniformly supplied from the gas supply nozzles throughout the inside of the processing chamber, such that the HSG silicon layers are uniformly formed on the lower electrodes of wafers by rotation of the wafer boat during processing.

It is to be understood that both the foregoing general description and the following detailed description are exemplary and explanatory and are intended to provide further explanation of the invention as claimed.

DETAILED DESCRIPTION OF THE PREFERRED EMBODIMENTS

The present invention now will be described more fully hereinafter with reference to the accompanying drawings, in which preferred embodiments of the invention are shown.

Figure 1:
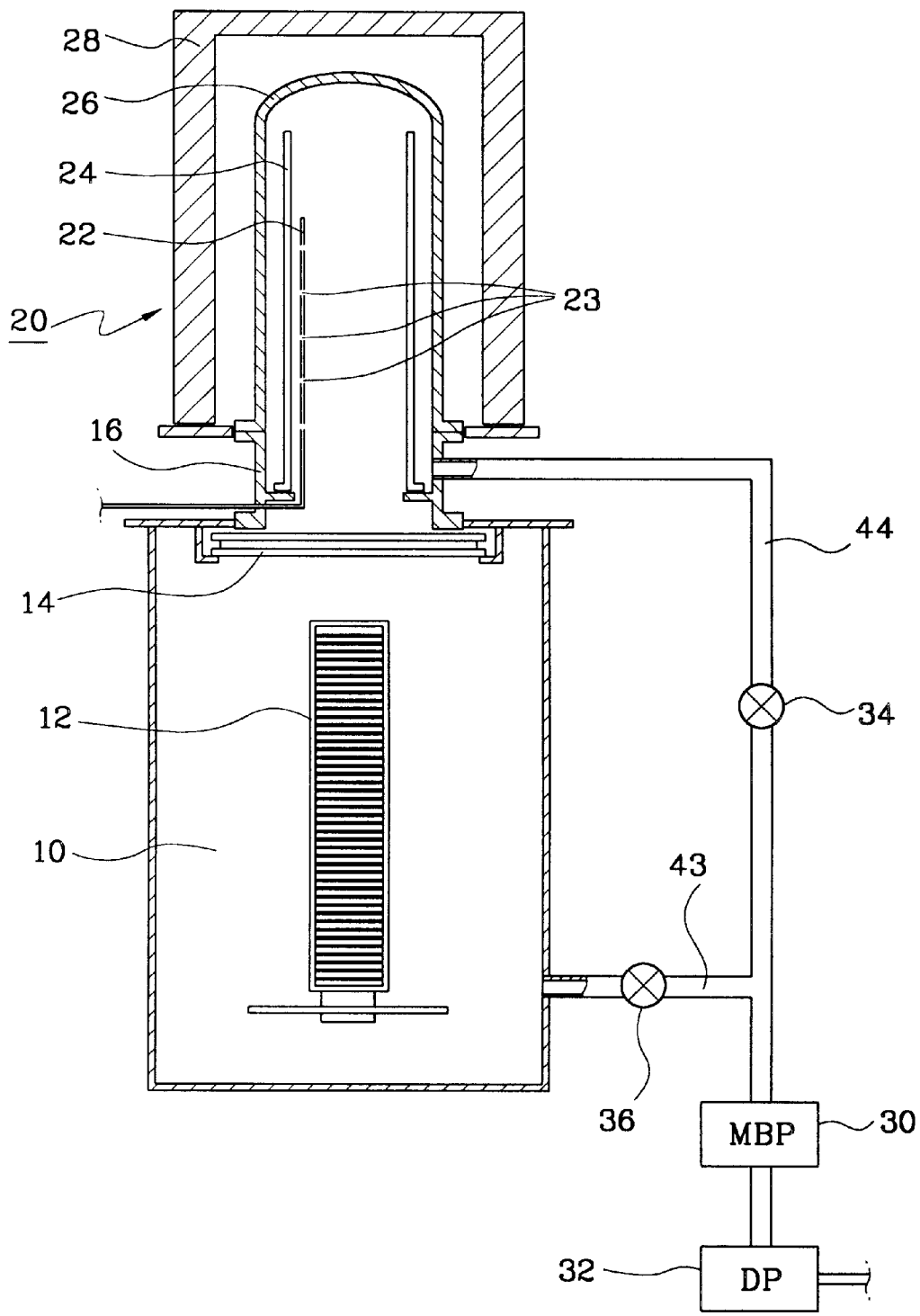
FIG. 1 is a schematic representation of a conventional apparatus for manufacturing semiconductor devices.
Figure 2:
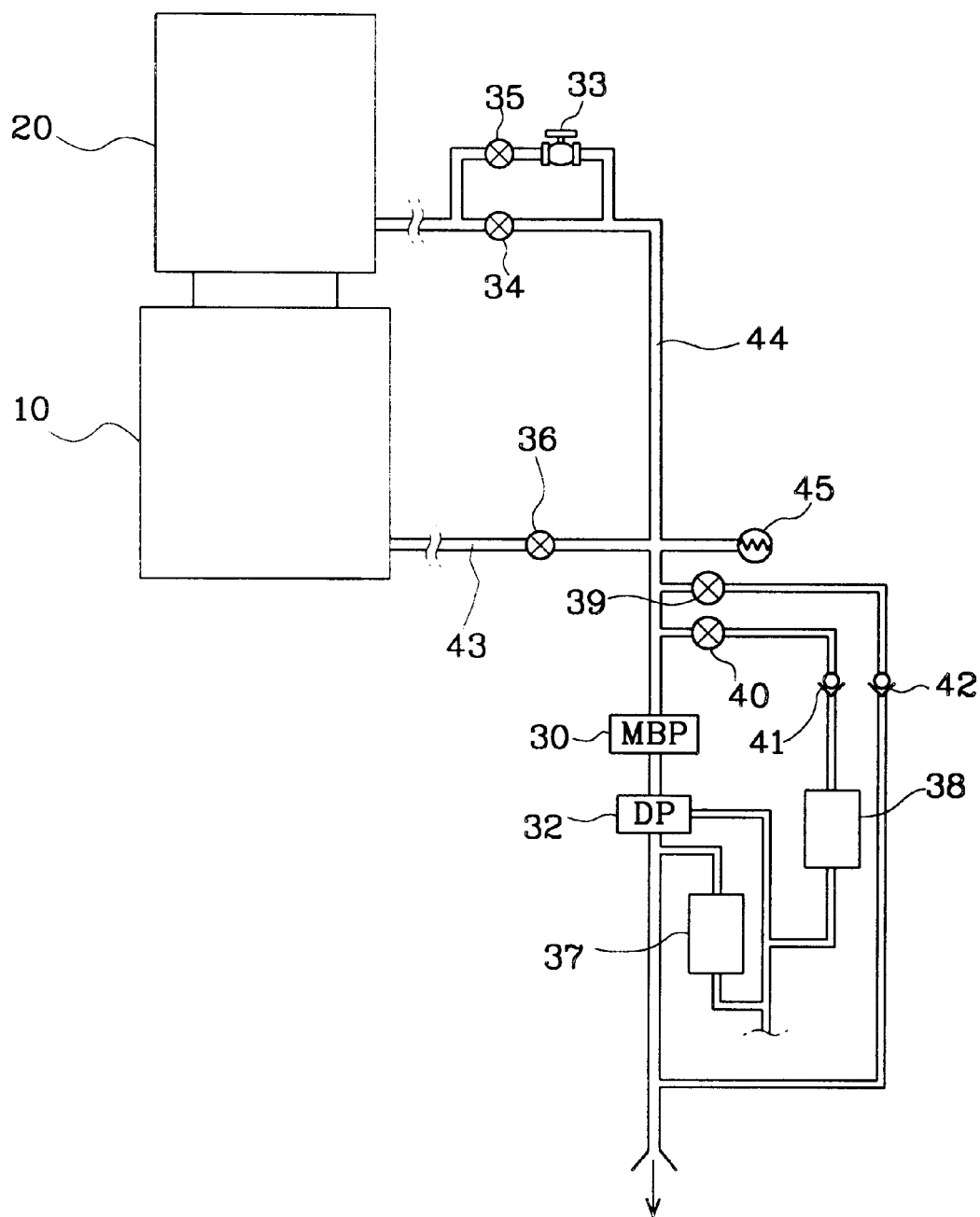
FIG. 2 is a detailed schematic representation of the vacuum system of the apparatus shown in FIG. 1.
Figure 3:
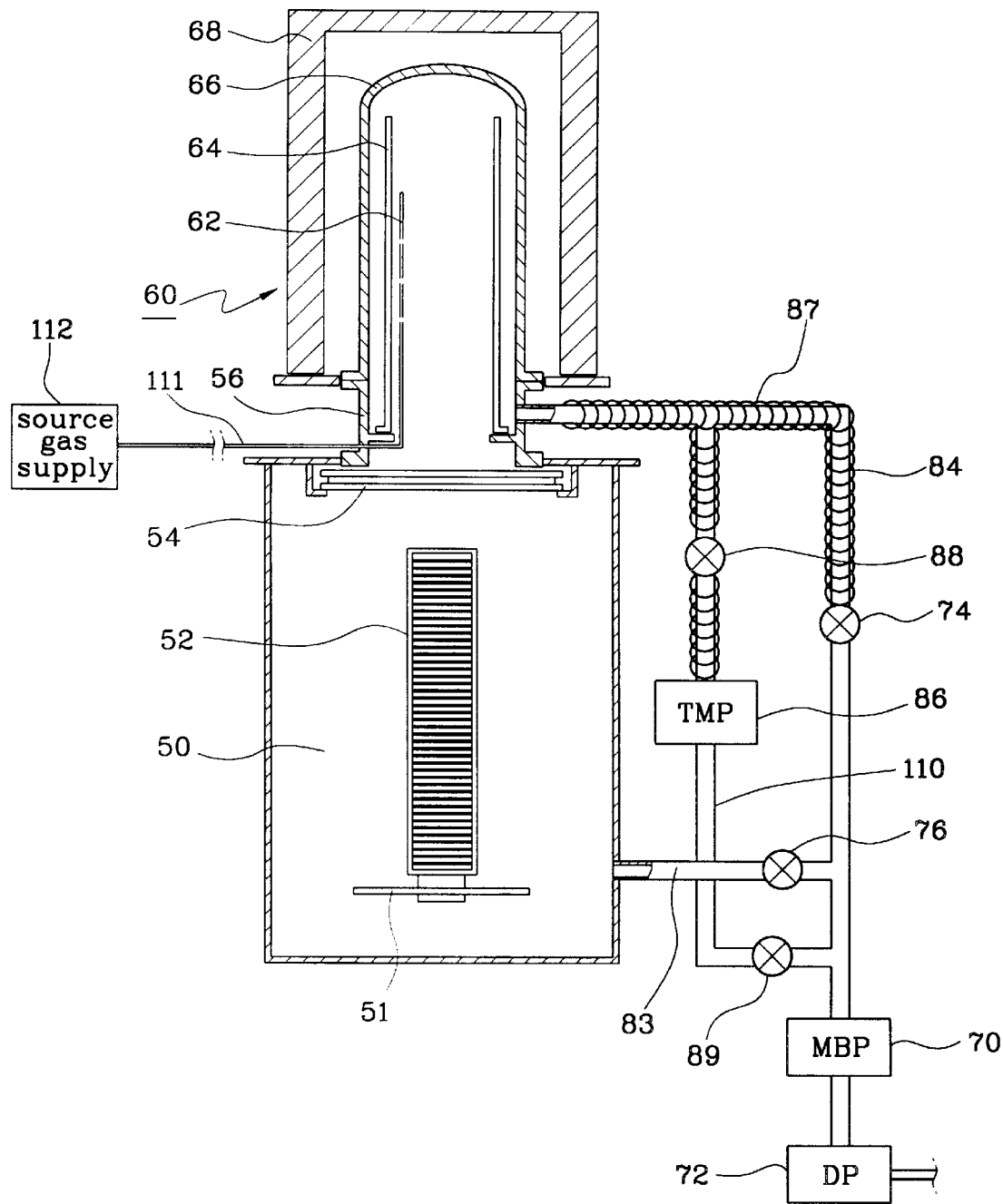
FIG. 3 is a schematic representation of the apparatus for manufacturing semiconductor devices according to an embodiment of the present invention.

FIG. 3 is a schematic representation of the apparatus for manufacturing semiconductor devices for the formation of HSG according to one embodiment of the present invention. The vertically aligned processing chamber 60 and loadlock chamber 50 are coupled by flange 56. A gate valve 54 is installed between the processing chamber 60 and the loadlock chamber 50 to separate the two chambers.

The processing chamber 60 has a double-tube structure, that is, an outer tube 66 with a dome-shaped sealed top covering an inner tube 64 with its top end opened. A heat block 68 covers the outer tube 66.

A plurality of gas supply nozzles 62 are vertically installed inside inner tube 64 to supply a source gas from a source gas supply 112 to the interior of the inner tube 64, through a supply line 111 which penetrates through the side wall of flange 56 and into the inner tube 64. The outer tube 66 and the inner tube 64 are made of quartz and/or SiC.

Figure 4:
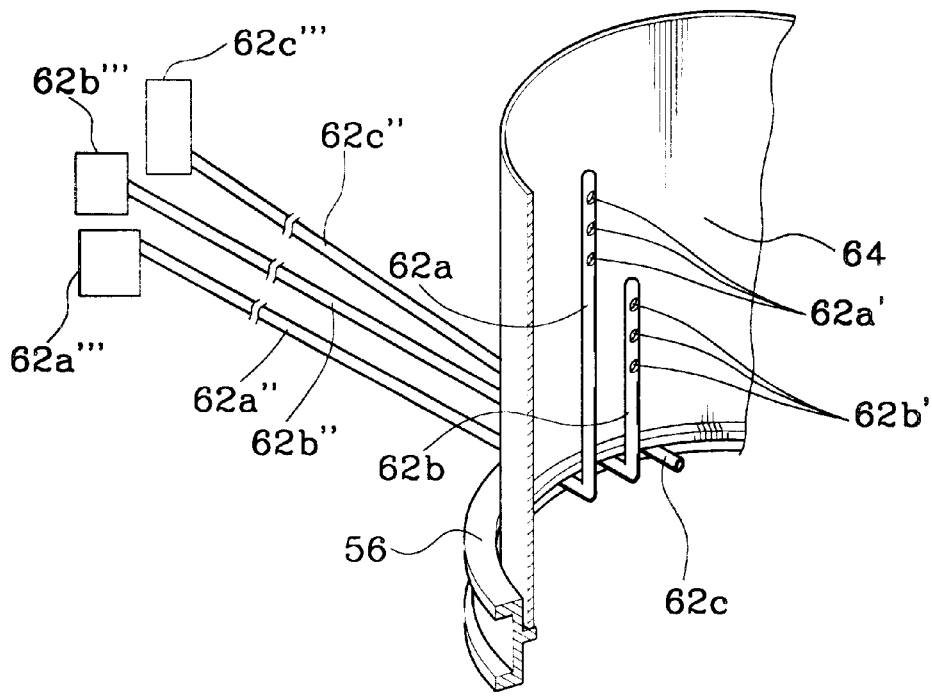
FIG. 4 is an enlarged perspective view of the source gas supply portion of the apparatus shown in FIG. 3.

FIG. 4 is an enlarged perspective view of the gas supply nozzles 62 shown in FIG. 3. Referring to FIG. 3 and FIG. 4, a plurality of gas supply nozzles 62 are installed inside the inner tube 64, the lengths of the nozzles each being different from one another. That is, a first supply nozzle 62a is for example, the tallest to supply the source gas to an upper area of the processing chamber 60, a second supply nozzle 62b and a third supply nozzle 62c are installed to supply the source gas for example, to a middle area and a lower area of the processing chamber 60, respectively. The top terminal ends of the first and second supply nozzles 62a and 62b are preferably sealed, and on their upper ends, spray openings 62a' and 62b' are formed, preferably three, with the openings having diameters different from each other, and being aligned at uniform intervals. The diameters of the spray openings 62a' and 62b' closer to top end of the supply nozzles are larger so that a source gas is uniformly supplied throughout the inside of the processing chamber 60. The end of the third supply nozzle 62c is preferably open so that the source gas is sprayed directly toward the lower area of the processing chamber 60.

While this embodiment preferably includes three gas supply nozzles, any number and shape of gas supply nozzles installed at any interval along the boundary line of the processing chamber 60, are contemplated provided that the number, size and location of the nozzles are sufficient to uniformly supply source gas to the interior of the inner chamber 64.

The number, height and distribution of nozzles can be readily selected and employed by one of ordinary skill in the art without undue experimentation depending upon the particular application and desired results. The location and the size of the spray openings of each supply nozzle are important parameters for controlling the density and the size of HSG nuclei. The location and size of the openings vary according to the particular application. The location and size can be determined, optimized and employed by one of ordinary skill in the art without undue experimentation.

As seen in FIG. 4, three spray openings 62a' of the first supply nozzle 62a are formed on its upper end to supply a source gas to the upper quarter of the wafers in boat 52, those spray openings 62b' of the second supply nozzles 62b providing gas to the middle one-half of the wafers, and the third supply nozzle 62c providing gas to the lower quarter of the wafers in boat 52 in the processing chamber. Preferably, each nozzle is made of quartz or SiC with about a ¼ inch diameter in order to prevent contaminants during the processing.

The first, second, and third gas supply nozzles 62a, 62b, 62c may branch from a single supply line 111 connected to a single source gas supply 112 as shown in FIG. 3. Alternatively, each nozzle 62a62b, 62c may have its own dedicated supply line 62a'', 62b'', 62c'' connected to a respective source gas supply 62a''', 62b''', 62c''', for supplying one or more types of source gas to the chamber. The source gas is selected from a silicon group gas, such as $SiH_4$ or $Si_2H_6$, for forming HSG.

Figure 5:
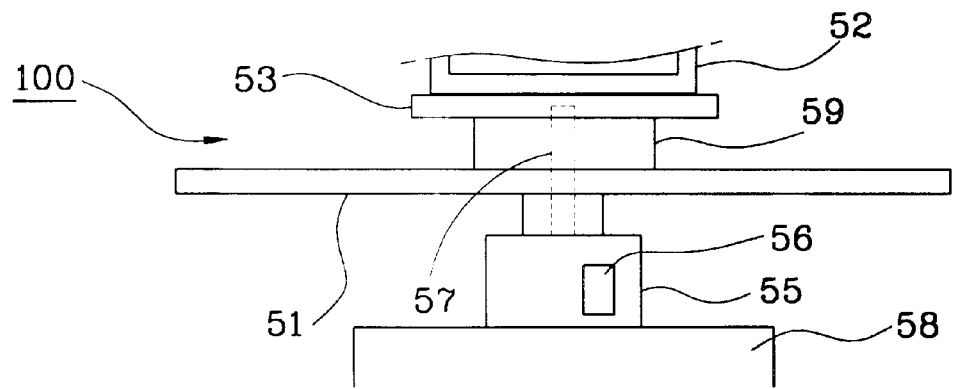
FIG. 5 is a side view of the rotating apparatus of the present invention for rotating the wafer boat.

FIG. 5 is a detailed representation showing the rotating apparatus 100 of the loadlock chamber 50 of FIG. 3. Referring to FIG. 5, the boat 52, placed on horizontal boat support 53, is vertically moved up and down by elevator 58 so that boat flange 51 moves towards the processing chamber 60 when the gate valve 54 opens. After the boat 52 is transferred to the processing chamber 60, the gate valve 54 is closed. Then, during wafer processing, the horizontal boat support 53 rotates boat 52 by the driving force of motor 55 transferred via the rotating shaft 57 connected to the boat support 53. The rotation speed of motor 55 is controlled by a controller 56 in motor 55. The rotating shaft 57 is covered with a bellows 59 to prevent the accumulation of the contaminants generated by any abrasion caused by rotation of the rotating shaft 57.

A nitrogen gas supply line (not shown) and an oxygen gas supply line (not shown) are preferably installed in the loadlock chamber to remove contaminants and control the formation of native oxide films.

Figure 6:
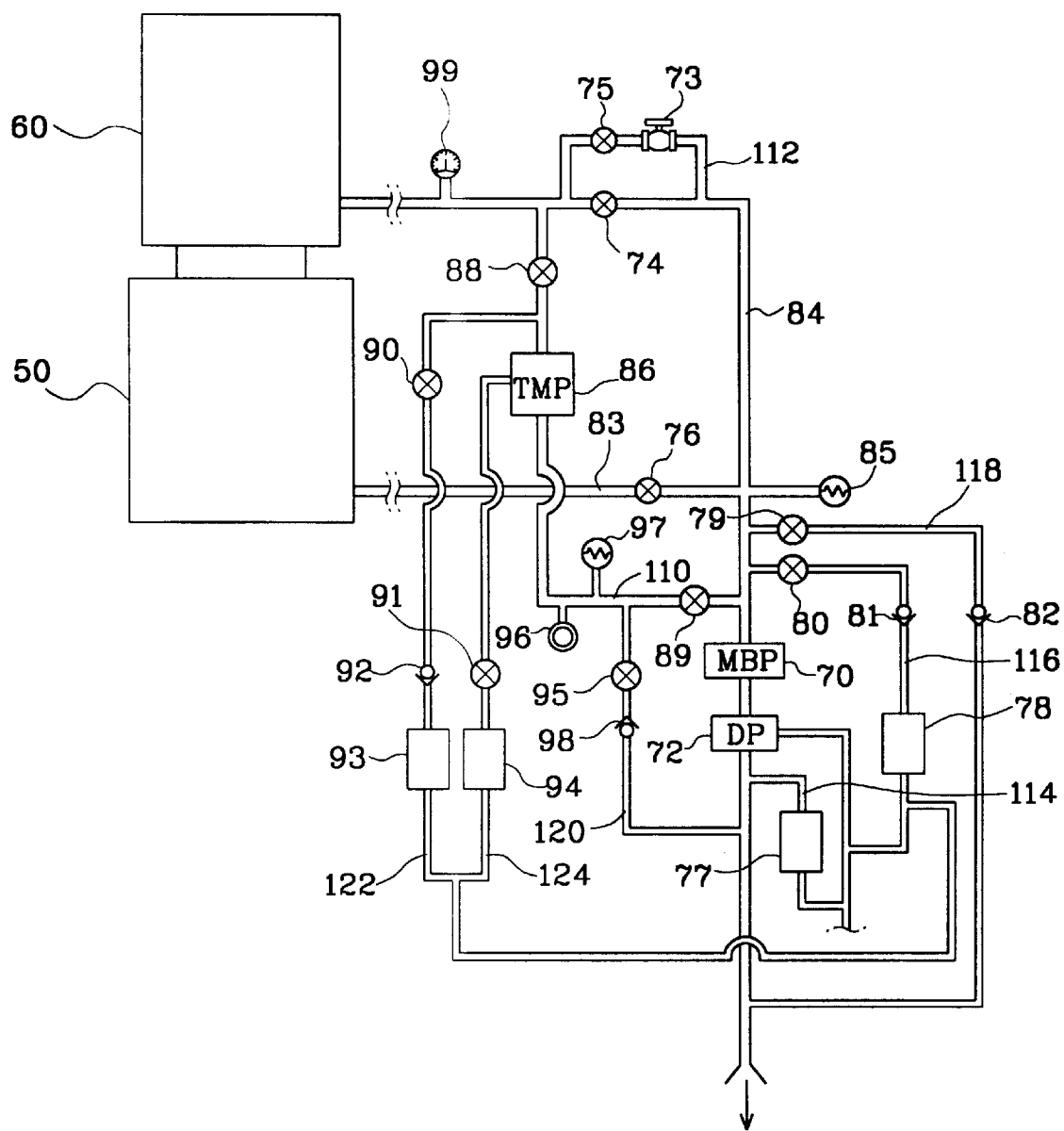
FIG. 6 is a detailed schematic representation of the vacuum system of the apparatus shown in FIG. 3.

FIG. 6 is a detailed representation of the vacuum system of FIG. 3. The vacuum system maintains the processing chamber 60 and the loadlock chamber 50 at a particular pressure. As shown in FIG. 3 and FIG. 6, the vacuum system includes a loadlock line 83, having an air valve 76, one end of which is connected to the lower end of the loadlock chamber 50. A processing line 84, having an air valve 74, has one end connected to the lower end of the outer tube 66 of the processing chamber. Loadlock line 83 and processing line 84 merge just prior to a first vacuum pump 70, and then pass through the first vacuum pump 70 and a second vacuum pump 72.

A first bypass vacuum line 110, having air valves 88 and 89, branches from the processing line 84 near the outer tube 66 and passes through a third vacuum pump 86. The air valves 88 and 89 are located on either side of the third vacuum pump 86. The bypass vacuum line 110 also leads to the first vacuum pump 70. As shown in FIG. 6, the bypass vacuum line 110 merges with the processing line 84 at a point downstream of the merge point of the loadlock line 83 and processing line 84, and prior to entering the first vacuum pump 70.

Just after the point where the first bypass vacuum line 110 branches from the processing line 84, a second bypass line 112, having air valve 75 and hand valve 73, is connected to the processing line 84 on either side of an air valve 74.

The first 70, second 72, and third 86 vacuum pumps are a mechanical booster pump (MBP), a dry pump (DP), and a turbo molecular pump (TMP), respectively. The booster pump and dry pump are rough or lower vacuum pumps with a pressure range of from 760 torr to $1 \times 10^{-3}$ torr. The pumps may be, for example, a piston rotation pump, an oil rotation pump, or a venturi pump.

The turbo molecular pump is high vacuum pump with a pressure range of from $1 \times 10^{-3}$ torr to $1 \times 10^{-8}$ torr. This pump may be, for example, an oil diffusion pump, a cryo trap and baffle pump, or a mechanical cryo pump. The turbo molecular pump is a clean mechanical pressure pump that provides momentum and direction to the gas molecules, is free from vibration because it employs a high speed rotation surface, and is used because it reaches a vacuum state in a short time at pressures less than $5 \times 10^{-10}$ torr.

The vacuum lines in the vacuum system are preferably made of stainless steel and polished to maximize the vacuum capability. Also, as shown in FIG. 3, heating tape 87 (i.e., a polymeric tape having a heating coil disposed therein) is installed in order to heat the portion of the vacuum system between the third vacuum pump 86 of the bypass line 110 to the outer tube 66 of the processing chamber 60, and between the air valve 74 (along the processing line 84) and the outer tube 66 of the processing chamber 60, so as to minimize the generation of waste gas and particle byproducts after processing is completed. The heating tape 87 is preferably maintained at a temperature of from 50° C. to 200° C.

The mechanical booster pump 70 and the dry pump 72 are cleaned using purge gas supplied through purge gas supply lines 114 and 116. Purge gas supply line 114 includes flow meter 77 installed thereon, and purge gas supply line 116 includes flow meter 78, a check valve 81, and an air valve 80, installed thereon. A third bypass line 118, having an air valve 79 and a check valve 82, is installed so as to bypass the mechanical booster pump 70 and the dry pump 72. A pressure measuring pirani gauge 85 is installed near the junction point of the processing line 84 and the loadlock line 83, before the mechanical booster pump 70.

At a point along the first bypass line 110, and between the third vacuum pump 86 and the first vacuum pump 70, a forth bypass line 120, having air valve 95 and a check valve 98, branches from the first bypass line 1 10 and bypasses the mechanical booster pump 70 and a dry pump 72.

Purge gas supply and discharge lines 122 and 124 are installed in order to clean the turbo molecular pump 86 with for example, nitrogen gas. The purge gas supply line 122 originates from a purge gas supply (not shown), passes through a flow meter 93, a check valve 92, and an air valve 90, and is connected to the first bypass line 110 between the turbo molecular pump 86 and air valve 88. Purge gas discharge line 124 originates from the turbo molecular pump 86, passes through air valve 91 and flow meter 94, and converges with purge gas supply line 122, with the converging lines being connected to the purge gas supply.

A pressure switch 96 and a pirani gauge 97 are installed on the first bypass line 110, in-line and downstream of turbo molecular pump 86. An ion gauge 99 is installed close to the processing chamber 60 on the processing line 84.

With reference to FIGS. 3 to 6, the vacuum system begins operating by first closing the air valves 74 and 89 connected to the processing chamber 60, and air valve 76 connected to the loadlock chamber 50, so as to maintain the loadlock chamber 50 and processing chamber 60 in a vacuum state when mechanical booster pump 70 and dry pump 72 begin to operate.

When the pressure of the processing chamber 60 reaches a certain predetermined value, e.g., 4 Pascal (i.e., $3 \times 10^{-2}$ Torr), the first bypass vacuum line 110 automatically opens and air valve 74 closes. That is, air valves 88 and 89 are opened while the turbo molecular pump 86 operates to reach a base vacuum in a short time.

Then, wafers having patterned lower electrodes are loaded onto boat 52 in the loadlock chamber 50 while the nitrogen gas supply line removes contaminants from the chamber and the oxygen gas supply line controls the formation of native oxide films. Subsequently, the boat 52 is moved from the loadlock chamber 50 to the processing chamber 60 via the elevator 58 after the gate valve 54 is opened. The boat 52 is then rotated by the motor 55 connected to the boat support 53 via the motor shaft 57. While the boat 52 is rotated, source gas for forming HSG is supplied to the processing chamber 60 via the plurality of nozzles 62a, 62b, 62c in order to uniformly process the wafers in the boat 52.

More specifically, the complete fabrication process includes stand-by, temperature ramp-up, HSG seeding and HSG growth steps.

The formation of native oxide films is prevented during the stand-by step by maintaining the processing chamber 60 at a temperature in the range of from 450° C. to 500° C. without oxygen. During the temperature ramp-up step, the temperature is increased from the 450° C. to 500° C. range, preferably to about 550° C. in order to maximize suitable seeding conditions. During this temperature ramp-up step, one should avoid overshooting a temperature of a certain value, for example 550° C.

During the seeding step, a seeding gas such as $SiH_4$ or $Si_2H_6$ is supplied from the gas supply nozzles 62 to the processing chamber 60 so as to form HSG nuclei on the lower electrode.

The growth step includes thermally treating the wafers at a temperature greater than 550° C., to grow the HSG nucleus. The upper temperature limit of the HSG growth step is approximately 800° C. At this time, the first, and second vacuum pumps 70 and 72 are operated to maintain a high vacuum state, and when the pressure of the processing chamber 60 reaches a specific predetermined value, e.g., 4 Pa., the third vacuum pump 86 is operated.

After the HSG silicon nucleus has sufficiently grown on the lower electrode and the processing is complete, gate valve 54 is opened and the boat 52 is lowered from the processing chamber 60 back into the loadlock chamber 50. The wafers are then cooled at a constant temperature and moved out of loadlock chamber 50.

According to the present invention, the formation of uniform films is achieved regardless of the location of the wafers in a single batch, by for example, uniformly supplying a source gas, and by rotating the boat during the processing operation.

Furthermore, by adding a high vacuum pump to the vacuum system of the present invention, the required vacuum state is achieved in a shorter time so that the density and the size of HSG nuclei are uniform, and result in an increased effective surface area of the capacitor, and thereby, an improved capacitance of the capacitor.

While the present invention has been described in detail, it should be understood that various changes, substitutions and alterations can be made hereto without departing from the spirit and scope of the invention as defined by the appended claims.

What is claimed is:

1. An apparatus for manufacturing semiconductor devices, comprising:
   a processing chamber for processing semiconductor wafers;
   a loadlock chamber vertically aligned with and disposed under said processing chamber;
   a vacuum system connected to said processing chamber and said loadlock chamber, said vacuum system comprising,
      a first vacuum pump and a second vacuum pump,
      a loadlock line having one end connected to said loadlock chamber,
      a processing line having one end connected to said processing chamber, wherein said loadlock line and said processing line merge at a first junction along said processing line before passing through the first vacuum pump and the second vacuum pump; and
      a bypass line branching off said processing line upstream of said first junction, said bypass line passing through a third vacuum pump and merging at a second junction along said processing line, said second junction being at a point between said first junction and said first vacuum pump.

2. The apparatus of claim 1, wherein said first, second, and third vacuum pumps comprise a mechanical booster pump, a dry pump, and a turbo molecular pump, respectively.

3. The apparatus of claim 2, further comprising purge gas supply and discharge lines connected to said third vacuum pump and a purge gas supply.

4. The apparatus of claim 3, further comprising a second bypass line branching from said bypass line between said third vacuum pump and said second junction and bypassing said first and second vacuum pumps.

5. The apparatus of claim 4, further comprising an ion gauge installed along said processing line between said processing chamber and a point where said bypass line branches from said processing line.

6. The apparatus of claim 1, wherein said processing line and said bypass line are made of stainless steel.

7. The apparatus of claim 6, wherein an interior surface of said processing line and said bypass line are polished.

8. The apparatus of claim 1, further comprising heating means installed around selected portions of said vacuum system, said selected portions being at least between said third vacuum pump of said bypass line to said processing chamber.

9. The apparatus of claim 8, wherein a temperature of said heating means is controlled within a range of from 50° C. to 200° C.

10. An apparatus for manufacturing semiconductor devices, comprising:
    a processing chamber for processing semiconductor wafers;
    a loadlock chamber vertically aligned with and disposed under said processing chamber;
    a plurality of gas supply nozzles in flow communication with said processing chamber, each of said gas supply nozzles having a length different from each other, and designated ones of said gas supply nozzles having a plurality of spaced apart spray openings for uniformly spraying a source gas throughout interior areas of said processing chamber;
    an elevator for vertically moving said wafers between said processing chamber and said loadlock chamber;
    a rotating apparatus for rotating said wafers in said processing chamber; and
    a vacuum system connected to said processing chamber and said loadlock chamber, said vacuum system comprising,
       a first vacuum pump and a second vacuum pump,
       a loadlock line having one end connected to said loadlock chamber,
       a processing line having one end connected to said processing chamber, wherein said loadlock line and said processing line merge at a first junction along said processing line before passing through the first vacuum pump and the second vacuum pump; and
       a bypass line branching off said processing line upstream of said first junction, said bypass line passing through a third vacuum pump and merging at a second junction along said processing line, said second junction being at a point between said first junction and said first vacuum pump.

11. The apparatus of claim 10, said gas supply nozzles comprising:
    a first supply nozzle extending vertically within said processing chamber and having vertically spaced spray openings for supplying said source gas to an upper interior area of said processing chamber;
    a second supply nozzle extending vertically within said processing chamber to a height less than said first supply nozzle, and having vertically spaced spray openings for supplying said source gas to a middle interior area of said processing chamber; and a third supply nozzle extending laterally within said processing chamber for supplying said source gas to a lower interior area of said processing chamber.

12. The apparatus of claim 11, wherein a top terminal end of said first supply nozzle and of second supply nozzle, are sealed, and a terminal end of said third supply nozzle is open.

13. The apparatus of claim 12, wherein diameters of said spray openings of said first and second gas supply nozzles increase as said openings approach the top terminal ends of said first and second gas supply nozzles.

14. The apparatus of claim 13, wherein said wafers are placed in a wafer boat and said rotating apparatus comprises means for controlling a rotation speed of said wafer boat.

15. The apparatus of claim 14, said rotating apparatus further comprising a horizontal boat support for mounting said wafer boat thereon, and a motor connected to said boat support via a rotating shaft for rotating said boat support.

16. The apparatus of claim 15, wherein said first, second, and third vacuum pumps comprise a mechanical booster pump, a dry pump, and a turbo molecular pump, respectively.

17. The apparatus of claim 16, further comprising purge gas supply and discharge lines connected to said third vacuum pump and a purge gas supply.

18. The apparatus of claim 17, further comprising a second bypass line branching from said bypass line between said third vacuum pump and said second junction and bypassing said first and second vacuum pumps.

19. The apparatus of claim 18, further comprising heating means installed around selected portions of said vacuum system, said selected portions being at least between said third vacuum pump of said bypass line to said processing chamber.

20. The apparatus of claim 19, further comprising a nitrogen gas supply line and an oxygen gas supply line installed in said loadlock chamber.

* * * * *